US010198216B2

(12) United States Patent
Balakrishnan et al.

(10) Patent No.: US 10,198,216 B2
(45) Date of Patent: Feb. 5, 2019

(54) LOW POWER MEMORY THROTTLING (71) Applicant: Advanced Micro Devices, Inc., Sunnyvale, CA (US)

(72) Inventors: Kedarnath Balakrishnan, Austin, TX (US); Kevin M. Brandl, Austin, TX (US); James R. Magro, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 12 days.

(21) Appl. No.: 15/168,043

(22) Filed: May 28, 2016

(65) Prior Publication Data
US 2017/0344309 A1   Nov. 30, 2017

(51) Int. Cl.
*G06F 3/06* (2006.01)
*G06F 13/16* (2006.01)
*G11C 7/04* (2006.01)
*G11C 11/406* (2006.01)
*G11C 11/4072* (2006.01)

(52) U.S. Cl.
CPC .......... *G06F 3/0659* (2013.01); *G06F 3/0625* (2013.01); *G06F 3/0673* (2013.01); *G06F 13/16* (2013.01); *G06F 13/1684* (2013.01); *G11C 7/04* (2013.01); *G11C 11/4072* (2013.01); *G11C 11/40615* (2013.01)

(58) Field of Classification Search
CPC .... G06F 1/3203; G06F 1/3206; G06F 1/3225; G06F 1/3275; G06F 1/3287
See application file for complete search history.

(56) References Cited

U.S. PATENT DOCUMENTS

| 6,141,283 | A  | * | 10/2000 | Bogin .................. G06F 1/3225 365/226 |
| 6,507,530 | B1 | * | 1/2003  | Williams ................. G11C 7/04 365/189.07 |
| 6,662,278 | B1 | * | 12/2003 | Kahn ...................... G06F 1/206 365/211 |
| 7,064,994 | B1 | * | 6/2006  | Wu ........................ G06F 1/206 365/211 |

(Continued)

OTHER PUBLICATIONS

International Search Report and Written Opinion for International Application No. PCT/US2016/053425, dated Feb. 27, 2017, 10 pages.

(Continued)

*Primary Examiner* — Midys Rojas
*Assistant Examiner* — Khoa D Doan
(74) *Attorney, Agent, or Firm* — Polansky & Associates, P.L.L.C.; Paul J. Polansky (57) ABSTRACT

In one form, a data processing system includes a memory channel having a plurality of ranks, and a data processor. The data processor is coupled to the memory channel and is adapted to access each of the plurality of ranks. In response to detecting a predetermined event, the data processor selects an active rank of the plurality of ranks and places other ranks besides the active rank in a low power state, wherein the other ranks include at least one rank with a pending request at a time of detection of the predetermined event. The data processor subsequently processes a memory access request to the active rank.

28 Claims, 5 Drawing Sheets

(56) References Cited

U.S. PATENT DOCUMENTS

| | | | |
|---|---|---|---|
| 7,191,088 B1* | 3/2007 | Reed | G01K 7/425 |
| | | | 374/100 |
| 7,240,143 B1* | 7/2007 | Scheffler | G06F 12/0284 |
| | | | 711/121 |
| 7,495,985 B1* | 2/2009 | Reed | G11C 7/04 |
| | | | 326/30 |
| 7,724,602 B2* | 5/2010 | Hur | G06F 13/1626 |
| | | | 365/226 |
| 2004/0193777 A1* | 9/2004 | LaBerge | G06F 13/4022 |
| | | | 711/5 |
| 2004/0199730 A1 | 10/2004 | Eggers et al. | |
| 2004/0260957 A1* | 12/2004 | Jeddeloh | G06F 1/206 |
| | | | 713/300 |
| 2005/0259496 A1* | 11/2005 | Hsu | G06F 1/206 |
| | | | 365/226 |
| 2007/0083701 A1* | 4/2007 | Kapil | G06F 1/3203 |
| | | | 711/106 |
| 2007/0106860 A1 | 5/2007 | Foster, Sr. et al. | |
| 2008/0177940 A1* | 7/2008 | Risse | G06F 13/4243 |
| | | | 711/105 |
| 2009/0019243 A1* | 1/2009 | Hur | G06F 1/3225 |
| | | | 711/158 |
| 2009/0094406 A1* | 4/2009 | Ashwood | G06F 13/404 |
| | | | 711/103 |
| 2009/0125737 A1* | 5/2009 | Brey | G06F 1/3203 |
| | | | 713/322 |
| 2010/0037073 A1* | 2/2010 | Huizenga | G06F 1/3203 |
| | | | 713/320 |
| 2010/0162020 A1* | 6/2010 | Maule | G11C 5/04 |
| | | | 713/324 |
| 2011/0252180 A1* | 10/2011 | Hendry | G06F 1/3203 |
| | | | 711/3 |
| 2013/0132704 A1* | 5/2013 | Ware | G06F 12/10 |
| | | | 711/206 |
| 2014/0059359 A1* | 2/2014 | Bahirat | G06F 1/324 |
| | | | 713/300 |
| 2015/0143026 A1 | 5/2015 | Reddy et al. | |
| 2015/0363109 A1* | 12/2015 | Frick | G06F 1/3203 |
| | | | 711/112 |

OTHER PUBLICATIONS

Bruce Jacob, Spencer W. Ng, David T. Wang; "Memory Systems: Cache, DRAM, Disk"; ISBN: 978-0-12-379751-3; © 2008 by Elsevier Inc.; 46 pages.

JEDEC Standard No. 79-4; "DDR4 SDRAM"; Sep. 2012; JEDEC Solid State Technology Association, 3103 North 10th Street, Suite 240, South Arlington, Virginia, 22201; 15 pages.

* cited by examiner

LOW POWER MEMORY THROTTLING

FIELD

This disclosure relates generally to data processing systems, and more specifically to data processing systems that can interface to memories with low power modes.

BACKGROUND

Computer systems typically use inexpensive and high density dynamic random access memory (DRAM) chips for main memory. Most DRAM chips sold today are compatible with various double data rate (DDR) DRAM standards promulgated by the Joint Electron Devices Engineering Council (JEDEC). DDR DRAMs offer both high performance and low power operation by providing various low power modes. One of these low power modes is known as precharge power down. During precharge power down, all banks are precharged, an on-chip delay locked loop (DLL) can be disabled, an input clock can be turned off, and output buffers can be disabled to significantly reduce power consumption. Precharge power down is relatively quick to exit, and exit time may be speeded up by keeping the DLL running. Another low power mode is active power down. Active power down differs from precharge power down in that at least one bank remains active, i.e. it has an open row, and thus it allows faster exit than precharge power down. Yet another low power mode is self refresh mode. In self refresh mode, all banks are idle and all external clocking is removed, but the DRAM maintains its contents by refreshing all rows periodically using a built-in timer.

Modern DDR memory controllers maintain queues to store pending memory access requests to allow them to pick the pending memory access requests out of order to increase efficiency. For example, the memory controllers can retrieve multiple memory access requests to the same row in a given rank of memory from the queue out of order and issue them consecutively to the memory system to avoid the overhead of precharging the current row and activating another row. In addition to improving efficiency the memory controllers place one or more ranks of DDR DRAMs in low power states in anticipation that the power savings will outweigh the extra time required to enter and exit this state. Known memory controllers do not place particular ranks of DDR DRAMs in a low power state unless there are no pending memory access requests to that rank in the queue.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a data processing system includes a memory channel, comprising a plurality of ranks, and a data processor. The data processor is coupled to the memory channel and is adapted to access each of the plurality of ranks. In response to a detection of a predetermined event, the data processor selects an active rank of the plurality of ranks and places other ranks besides the active rank in a low power state, wherein the other ranks include at least one rank with a pending request at the detection of the predetermined event. The data processor subsequently processes a memory access request to the active rank.

In another form, a data processor includes a memory accessing agent and a memory controller coupled to the memory accessing agent. The memory controller is adapted to couple to a memory system comprising a first plurality of ranks. The memory controller in response to detection of a first predetermined event selects an active rank of the first plurality of ranks while placing other ranks of the first plurality of ranks besides the active rank in a low power state. For example the predetermined event may be a thermal event and the low power state may be a precharge power down state. The other ranks include at least one rank with a pending request at time of the detection of the predetermined event. The memory controller subsequently processes at least one memory access request to the active rank.

In yet another form, a method for throttling memory accesses to a memory system may be used to mitigate potentially harmful thermal events. A thermal event is detected and in response to detection of the thermal event, an active rank of a plurality of ranks is selected, while other ranks of the plurality of ranks besides the active rank are placed in a low power state. The other ranks include at least one rank with a pending request. At least one memory access request to the active rank is processed.

Figure 1:
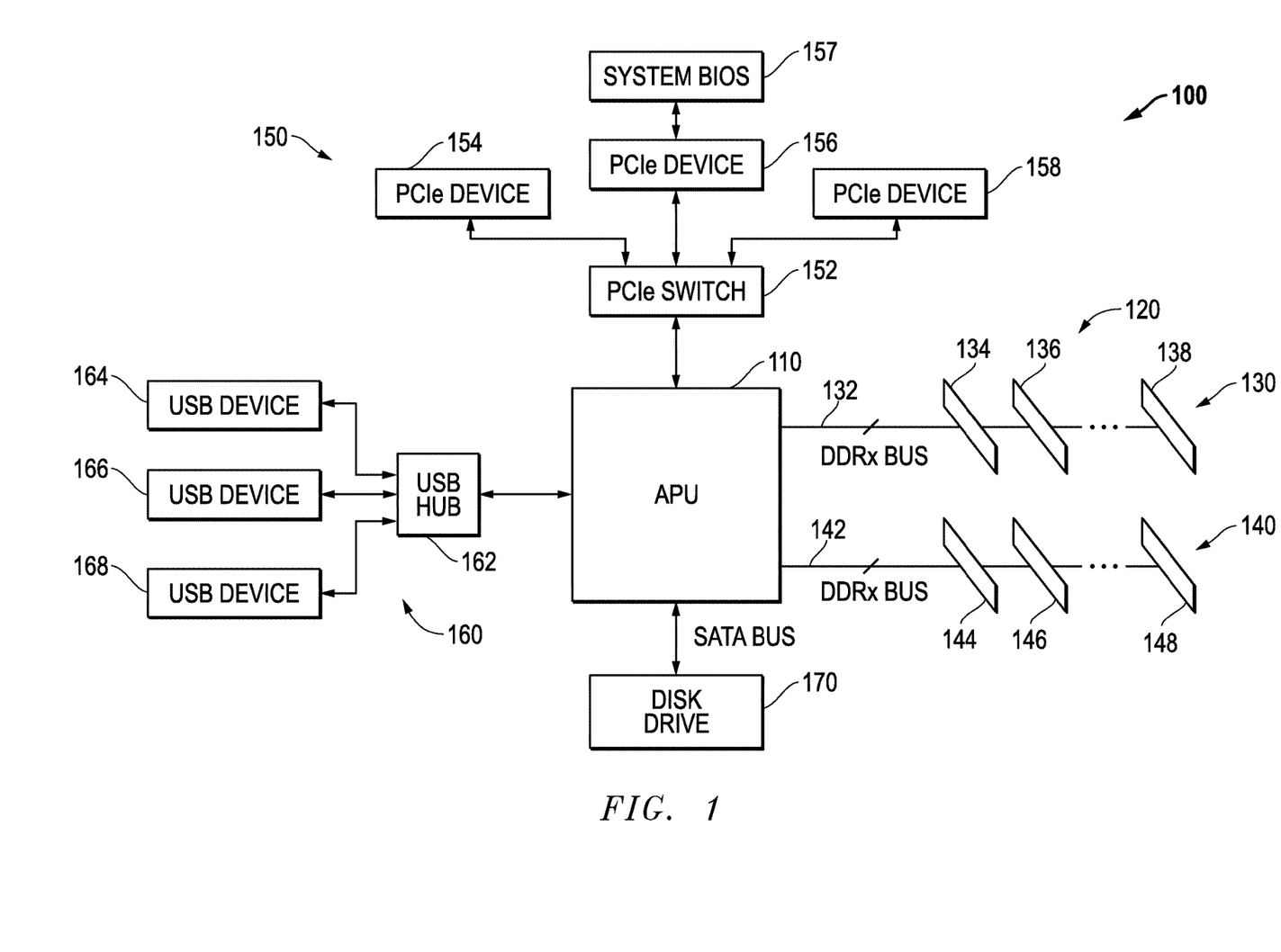
FIG. 1 illustrates in block diagram form a data processing system according to some embodiments.

FIG. 1 illustrates in block diagram form a data processing system 100 according to some embodiments. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks.

Likewise memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring. As will be described in more detail below, data processor 110 includes a memory controller that is capable of throttling power in certain circumstances to avoid overheating and to reduce the chance of thermal overload.

Figure 2:
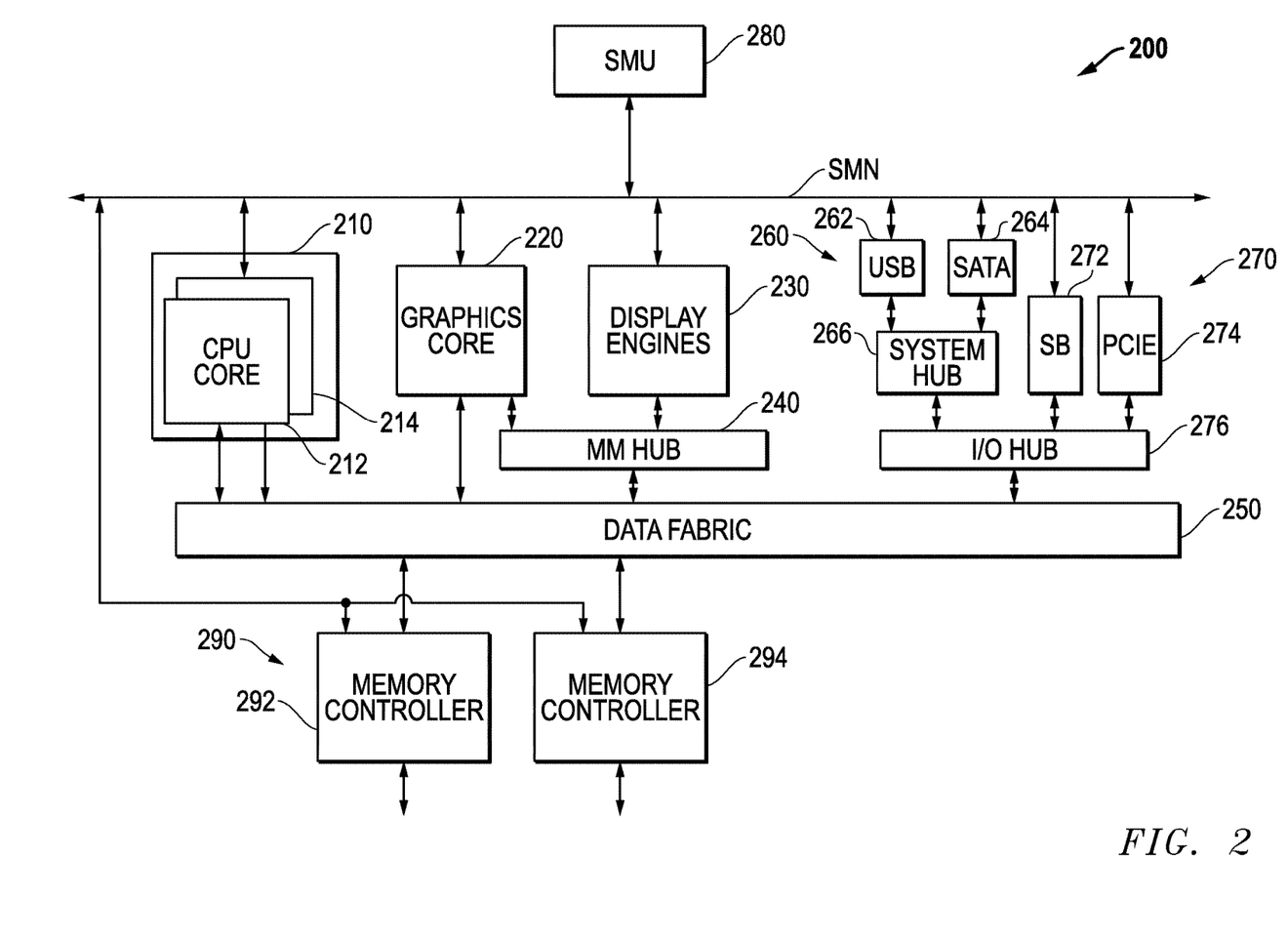
FIG. 2 illustrates in block diagram form an advanced processing unit (APU) suitable for use in the data processing system of FIG. 1.

FIG. 2 illustrates in block diagram form an APU 200 suitable for use in data processing system 100 of FIG. 1. APU 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290.

CPU core complex 210 includes a CPU core 212 and a CPU core 214. In this example, CPU core complex 210 includes two CPU cores, but in other embodiments CPU core complex can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

APU 200 also implements various system monitoring and power saving functions. In particular one system monitoring function is thermal monitoring. For example, if APU 200 becomes hot, then SMU 280 can reduce the frequency and voltage of CPU cores 212 and 214 and/or graphics core 220. If APU 200 becomes too hot, then it can be shut down entirely. Thermal events can also be received from external sensors by SMU 280 via the SMN bus, and SMU 280 can reduce the clock frequency and/or power supply voltage in response.

Figure 3:
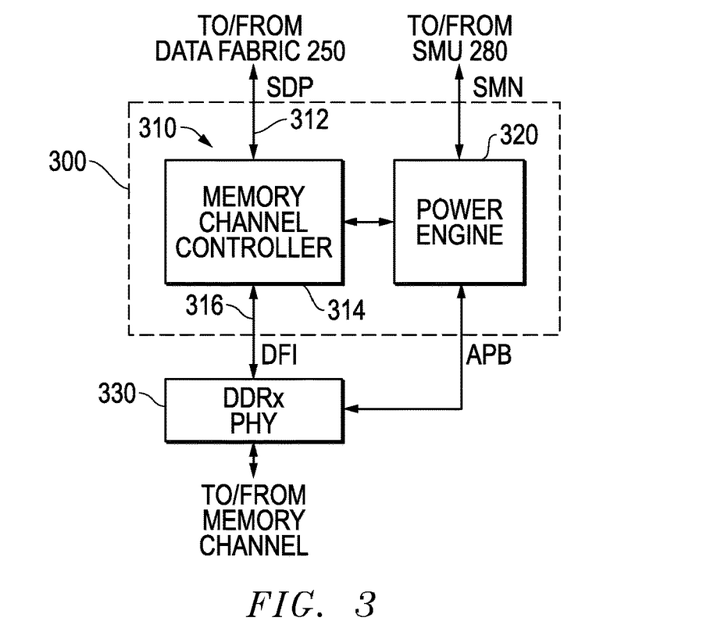
FIG. 3 illustrates in block diagram form a memory controller and associated physical interface (PHY) suitable for use in the APU of FIG. 2 according to some embodiments.

FIG. 3 illustrates in block diagram form a memory controller 300 and an associated physical interface (PHY) 330 suitable for use in APU 200 of FIG. 2 according to some embodiments. Memory controller 300 includes a memory channel 310 and a power engine 320. Memory channel 310 includes a host interface 312, a memory channel controller 314, and a physical interface 316. Host interface 312 bidirectionally connects memory channel controller 314 to data fabric 250 over a scalable data port (SDP). Physical interface 316 bidirectionally connects memory channel controller 314 to PHY 330 over a bus that conforms to the DDR-PHY Interface Specification (DFI). Power engine 320 is bidirectionally connected to SMU 280 over the SMN bus, to PHY 330 over the Advanced Peripheral Bus (APB), and is also bidirectionally connected to memory channel controller 314. PHY 330 has a bidirectional connection to a memory channel such as memory channel 130 or memory channel 140 of FIG. 1. Memory controller 300 is an instantiation of a memory controller for a single memory channel using a single memory channel controller 314, and has a power engine 320 to control operation of memory channel controller 314 in a manner that will be described further below.

Figure 4:
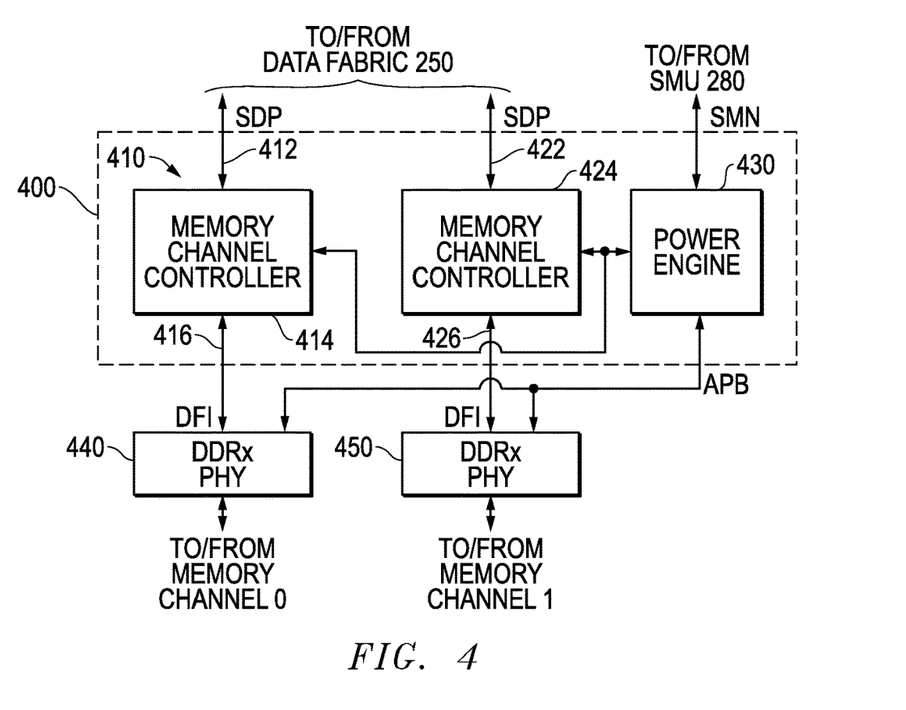
FIG. 4 illustrates in block diagram form another memory controller and associated PHY suitable for use in the APU of FIG. 2 according to some embodiments.

FIG. 4 illustrates in block diagram form another memory controller 400 and associated PHYs 440 and 450 suitable for use in APU 200 of FIG. 2 according to some embodiments. Memory controller 400 includes memory channels 410 and 420 and a power engine 430. Memory channel 410 includes a host interface 412, a memory channel controller 414, and a physical interface 416. Host interface 412 bidirectionally connects memory channel controller 414 to data fabric 250 over an SDP. Physical interface 416 bidirectionally connects memory channel controller 414 to PHY 440, and conforms to the DFI Specification. Memory channel 420 includes a host interface 422, a memory channel controller 424, and a physical interface 426. Host interface 422 bidirectionally connects memory channel controller 424 to data fabric 250 over another SDP. Physical interface 426 bidirectionally connects memory channel controller 424 to PHY 450, and conforms to the DFI Specification. Power engine 430 is bidirectionally connected to SMU 280 over the SMN bus, to PHYs 440 and 450 over the APB, and is also bidirectionally connected to memory channel controllers 414 and 424. PHY 440 has a bidirectional connection to a memory channel such as memory channel 130 of FIG. 1. PHY 450 has a bidirectional connection to a memory channel such as memory channel 140 of FIG. 1. Memory controller 400 is an instantiation of a memory controller having two memory channel controllers and uses a shared power engine 430 to control operation of both memory channel controller 414 and memory channel controller 424 in a manner that will be described further below.

Figure 5:
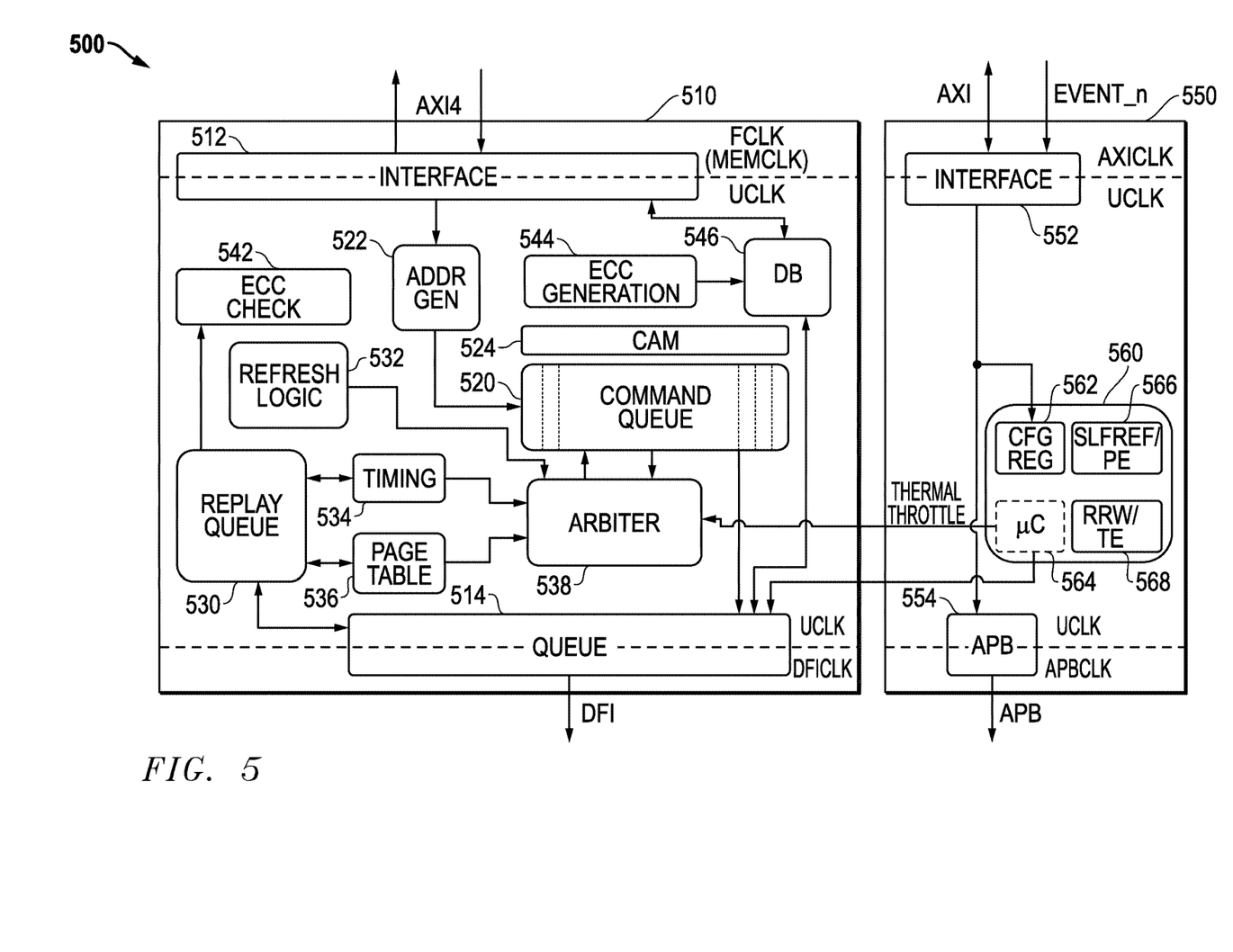
FIG. 5 illustrates in block diagram form a memory controller according to some embodiments.

FIG. 5 illustrates in block diagram form a memory controller 500 according to some embodiments. Memory controller 500 includes generally a memory channel controller 510 and a power controller 550. Memory channel controller 510 includes generally an interface 512, a queue 514, a command queue 520, an address generator 522, a content addressable memory (CAM) 524, a replay queue 530, a refresh logic block 532, a timing block 534, a page table 536, an arbiter 538, an error correction code (ECC) check block 542, an ECC generation block 544, and a data buffer (DB) 546.

Interface 512 has a first bidirectional connection to data fabric 250 over an external bus, and has an output. In memory controller 500, this external bus is compatible with the advanced extensible interface version four specified by ARM Holdings, PLC of Cambridge, England, known as "AXI4", but can be other types of interfaces in other embodiments. Interface 512 translates memory access requests from a first clock domain known as the FCLK (or MEMCLK) domain to a second clock domain internal to memory controller 500 known as the UCLK domain. Similarly, queue 514 provides memory accesses from the UCLK domain to the DFICLK domain associated with the DFI interface.

Address generator 522 decodes addresses of memory access requests received from data fabric 250 over the AXI4 bus. The memory access requests include access addresses in the physical address space represented in a normalized format. Address generator 522 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group. On startup, the system BIOS queries the memory devices in memory system 120 to determine their size and configuration, and programs a set of configuration registers associated with address generator 522. Address generator 522 uses the configuration stored in the configuration registers to translate the normalized addresses into the appropriate format. Command queue 520 is a queue of memory access requests received from the memory accessing agents in data processing system 100, such as CPU cores 212 and 214 and graphics core 220. Command queue 520 stores the address fields decoded by address generator 522 as well other address information that allows arbiter 538 to select memory accesses efficiently, including access type and quality of service (QoS) identifiers. CAM 524 includes information to enforce ordering rules, such as write after write (WAW) and read after write (RAW) ordering rules.

Replay queue 530 is a temporary queue for storing memory accesses picked by arbiter 538 that are awaiting responses, such as address and command parity responses, write cyclic redundancy check (CRC) responses for DDR4 DRAM or write and read CRC responses for gDDR5 DRAM. Replay queue 530 accesses ECC check block 542 to determine whether the returned ECC is correct or indicates an error. Replay queue 530 allows the accesses to be replayed in the case of a parity or CRC error of one of these cycles.

Refresh logic 532 includes state machines for various powerdown, refresh, and termination resistance (ZQ) calibration cycles that are generated separate from normal read and write memory access requests received from memory accessing agents. For example, if a memory rank is in precharge powerdown, it must be periodically awakened to run refresh cycles. Refresh logic 532 generates refresh commands periodically to prevent data errors caused by leaking of charge off storage capacitors of memory cells in DRAM chips. In addition, refresh logic 532 periodically calibrates ZQ to prevent mismatch in on-die termination resistance due to thermal changes in the system.

Arbiter 538 is bidirectionally connected to command queue 520 and is the heart of memory channel controller 510. It improves efficiency by intelligent scheduling of accesses to improve the usage of the memory bus. Arbiter 538 uses timing block 534 to enforce proper timing relationships by determining whether certain accesses in command queue 520 are eligible for issuance based on DRAM timing parameters. For example, each DRAM has a minimum specified time between activate commands, known as "$t_{RC}$". Timing block 534 maintains a set of counters that determine eligibility based on this and other timing parameters specified in the JEDEC specification, and is bidirectionally connected to replay queue 530. Page table 536 maintains state information about active pages in each bank and rank of the memory channel for arbiter 538, and is bidirectionally connected to replay queue 530.

In response to write memory access requests received from interface 512, ECC generation block 544 computes an ECC according to the write data. DB 546 stores the write data and ECC for received memory access requests. It outputs the combined write data/ECC to queue 514 when arbiter 538 picks the corresponding write access for dispatch to the memory channel.

Power controller 550 generally includes an interface 552 to an advanced extensible interface, version one (AXI), an APB interface 554, and a power engine 560. Interface 552 has a first bidirectional connection to the SMN, which includes an input for receiving an event signal labeled "EVENT_n" shown separately in FIG. 5, and an output. APB interface 554 has an input connected to the output of interface 552, and an output for connection to a PHY over an APB. Power engine 560 has an input connected to the output of interface 552, an output connected to an input of queue 514, and an output for providing a signal labeled "THERMAL THROTTLE". Power engine 560 includes a set of configuration registers 562, a microcontroller (μC) 564, a self refresh controller (SLFREF/PE) 566, and a reliable read/write timing engine (RRW/TE) 568. Configuration registers 562 are programmed over the AXI bus, and store configuration information to control the operation of various blocks in memory controller 500. Accordingly, configuration registers 562 have outputs connected to these blocks that are not shown in detail in FIG. 5. Self refresh controller 566 is an engine that allows the manual generation of refreshes in addition to the automatic generation of refreshes by refresh logic 532. Reliable read/write timing engine 568 provides a continuous memory access stream to memory or I/O devices for such purposes as DDR interface maximum read latency (MRL) training and loopback testing. μC 564 is used to determine, among other things, whether to throttle thermal events. Thus in response to an activation of the EVENT_n signal, μC 564 determines the settings of configuration registers 562 and if selected activates the THERMAL THROTTLE signal.

Memory channel controller 510 includes circuitry that allows it to pick memory accesses for dispatch to the associated memory channel. In order to make the desired arbitration decisions, address generator 522 decodes the address information into predecoded information including rank, row address, column address, bank address, and bank group in the memory system, and command queue 520 stores the predecoded information. Configuration registers 562 store configuration information to determine how address generator 522 decodes the received address information. Arbiter 538 uses the decoded address information, timing eligibility information indicated by timing block 534, and active page information indicated by page table 536 to efficiently schedule memory accesses while observing other criteria such as QoS requirements. For example, arbiter 538 implements a preference for accesses to open pages to avoid the overhead of precharge and activation commands required to change memory pages, and hides overhead accesses to one bank by interleaving them with read and write accesses to another bank. In particular during normal operation, arbiter 538 normally keeps pages open in different banks until they are required to be precharged prior to selecting a different page.

If at least one DIMM in the associated memory channel overheats, then the memory channel activates the EVENT_n signal. The EVENT_n signal is a wire-ORed signal that indicates a thermal event has occurred in one or more of the ranks of the memory channel. In response to detecting the activation of the EVENT_n signal, power engine 560 is programmable to activate the THERMAL THROTTLE signal. In response to the activation of the THERMAL THROTTLE signal, arbiter 538 changes its policy to change the tradeoff between low power and efficiency to favor low power. Note that in other embodiments, power engine 560 can detect an event without the use of an event input signal, such as by polling a register that is set in response to an event. Arbiter 538 selects an active rank of the plurality of ranks and places other ranks besides the active rank in a low power state. In this case the other ranks include at least one rank with a pending request at the activation of the THERMAL THROTTLE signal. Arbiter 538 then picks a memory access request to the active rank. In some circumstances, this memory access request would normally have been bypassed to service another request to provide access efficiency or to hide overhead accesses.

Figure 6:
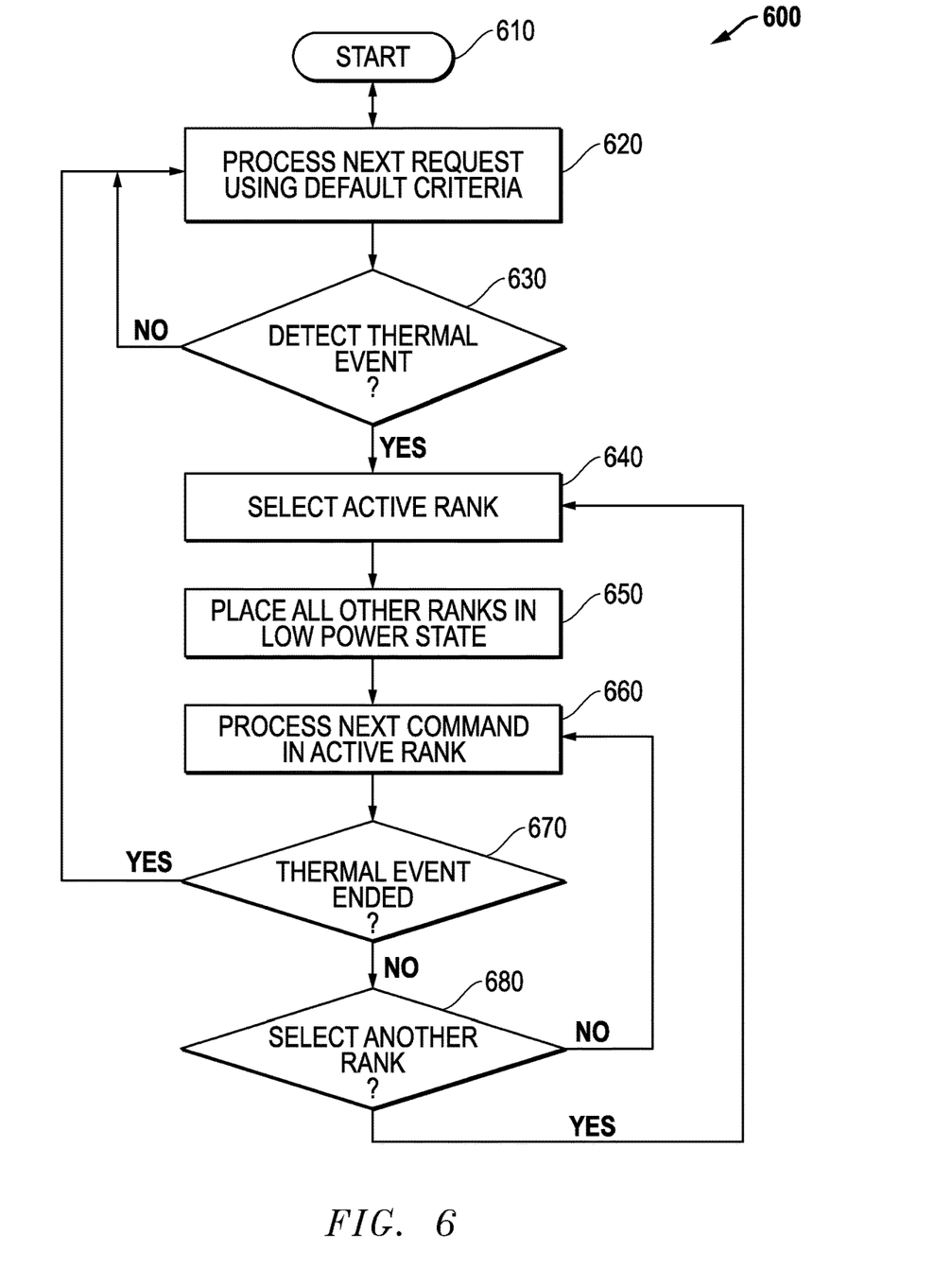
FIG. 6 illustrates a flow diagram that may be used by the memory controller of FIG. 5 according to some embodiments.

FIG. 6 illustrates a flow diagram 600 that may be used by memory controller 500 of FIG. 5 according to some embodiments. Flow starts at box 610. At action box 620, arbiter 538 processes the next request or requests in synchronism with the UCLK signal using default criteria as discussed with reference to FIG. 5 above. At decision box 630, arbiter 538 detects a thermal event by determining whether the THERMAL THROTTLE signal is active. If the THERMAL THROTTLE signal is not active, then flow returns to action box 620 and arbiter 538 processes the next request or requests in synchronism with the UCLK signal using the default criteria. If the THERMAL THROTTLE signal is active, however, then flow proceeds to action box 640. In action box 640, arbiter 538 selects an active rank as either the current rank if more requests remain pending, or another rank. At action box 650, arbiter 538 places other ranks besides the active rank in a low power state, such as the active power down state, the precharge power down state, or the self-refresh state. At action box 660, memory controller 500 processes at least one memory access request to the active rank.

At decision box 670, arbiter 538 determines whether the thermal event has ended by sampling the THERMAL THROTTLE signal. If the THERMAL THROTTLE signal is inactive, indicating that the thermal event has ended, flow proceeds to back to action box 620 in which arbiter 538 processes the next request determined by the default criteria. Note that multiple banks may become active at the same time as allowed using the default criteria. If the THERMAL THROTTLE signal is still active indicating that the thermal event has not ended, then flow proceeds to decision box 680. Decision box 680 determines whether to select another rank. For example, if all requests to the active rank in command queue 520 have been processed, then another rank will be selected (assuming the other rank has one or more pending requests). Other criteria are also possible, such as having no further pending requests to the current page in the active rank, or less than a certain number of other requests for that channel pending. In this case, flow proceeds back to action box 640 and arbiter 538 selects a new active rank, placing all other ranks (including the recently active rank) into the low power state. If arbiter 538 does not select another rank, then flow returns to action box 660 and arbiter 538 processes the next command in the active rank.

Unlike known memory controllers, memory controller 500 places all ranks besides an active rank in the low power state, wherein one or more of these other ranks contain a pending request. By not conditioning the decision to place a certain rank in low power based on whether there are any pending requests, memory controller 500 reduces power to all but the current rank to better mitigate the thermal event. Moreover memory controller 500 recognizes that it is desirable in the presence of the thermal event to change the balance in the tradeoff between latency and fairness, and power consumption. In the presence of a thermal event, memory controller 500 moves the balance toward lower power consumption, which helps mitigate the thermal event.

The method of FIG. 6 may be implemented with various combinations of hardware and software. For example FIG. 5 illustrates an embodiment of a memory controller that uses μC 564 to detect and report the thermal event that operates under the control of software, whereas arbiter 538 is implemented with hardware circuitry. This hardware circuitry may include priority encoders, finite state machines, programmable logic arrays (PLAs), and the like. However in other embodiments, arbiter 538 could be implemented with a microcontroller executing stored program instructions. Some of the software components may be stored in a computer readable storage medium for execution by at least one processor. Moreover some or all of the method illustrated in FIG. 6 may also be governed by instructions that are stored in a computer readable storage medium and that are executed by at least one processor. Each of the operations shown in FIG. 6 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Memory controller 500 of FIG. 5 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the memory controller may place the memory into various low power states that are different than the active power down, precharge powerdown, and self refresh states described above. Moreover the internal architecture of memory channel controller 510 and/or power engine 550 may vary in different embodiments. Memory controller 500 may interface to various types of memory including DDRx memory, HBM, RAMbus DRAM (RDRAM), and similar memories. While the illustrated embodiment showed each rank of memory corresponding to separate DIMMs, in other embodiments each DIMM can support multiple ranks.

Accordingly, it is intended by the appended claims to cover all modifications of the disclosed embodiments that fall within the scope of the disclosed embodiments.

What is claimed is:

1. A data processing system comprising:
   a memory channel comprising a memory bus and a plurality of ranks coupled to said memory bus, wherein each rank comprises a set of memory devices that operate in lockstep to respond to a given command and that are coupled to a respective one of a plurality of chip select signals; and
   a data processor coupled to said memory channel, adapted to access each of said plurality of ranks wherein in response to a detection of a predetermined event, said data processor selects an active rank of said plurality of ranks and places other ranks besides said active rank in a low power state, wherein said other ranks include at least one rank for which said data processor stores a pending request at a time of said detection of said predetermined event, and wherein said data processor subsequently processes a memory access request to said active rank.

2. The data processing system of claim 1 wherein said predetermined event indicates a thermal event and said at least one of said plurality of ranks comprises a temperature sensor having an output for providing an event signal to indicate said thermal event.

3. The data processing system of claim 2 wherein each of said plurality of ranks comprises a respective temperature sensor having a respective open-drain output coupled to an event input conductor.

4. The data processing system of claim 1 wherein said data processor processes a next command in said active rank in response to detecting that said predetermined event has not ended and determining not to select another rank based on predetermined criteria.

5. The data processing system of claim 4 wherein said predetermined criteria comprise at least one pending request in said active rank.

6. The data processing system of claim 4 wherein said predetermined criteria comprise at least one pending request in a current page in said active rank.

7. The data processing system of claim 4 wherein said predetermined criteria comprise at least one pending request in said active rank and less than a predetermined number of requests for other ranks.

8. The data processing system of claim 1 wherein said memory channel comprises a plurality of ranks of double data rate (DDR) memory.

9. The data processing system of claim 8 wherein said low power state comprises a DDR low power state.

10. A data processor comprising:
    a memory accessing agent; and
    a memory controller coupled to said memory accessing agent and adapted to couple to a memory system comprising a memory bus and a first plurality of ranks coupled to said memory bus, wherein each rank comprises a set of memory devices that operate in lockstep to respond to a given command and that are coupled to a respective one of a plurality of chip select signals, wherein said memory controller in response to detection of a first predetermined event selects an active rank of said first plurality of ranks while placing other ranks of said first plurality of ranks besides said active rank in a low power state, wherein said other ranks include at least one rank for which said memory controller stores a pending request at a time of said detection of said first predetermined event, and wherein said memory controller subsequently processes at least one memory access request to said active rank.

11. The data processor of claim 10 wherein said first predetermined event comprises a thermal event.

12. The data processor of claim 10 wherein said low power state comprises one of: an active powerdown state, a precharge powerdown state, and a self-refresh state.

13. The data processor of claim 10 wherein said memory controller is adapted to access at least one of a double data rate (DDR) version four (DDR4) memory channel and a graphics DDR version five (gDDR5) memory channel, and a high bandwidth memory (HBM) memory channel.

14. The data processor of claim 10 wherein said memory controller comprises:
a first memory channel controller coupled to:
a first host interface for receiving a first plurality of access requests and conducting data in response to said first plurality of access requests, and
a first physical interface; and
a power engine coupled to said first memory channel controller and responsive to said first predetermined event to cause said first memory channel controller to select said active rank of said first plurality of ranks and place said other ranks besides said active rank in said low power state.

15. The data processor of claim 14 wherein said memory controller further comprises:
a second memory channel controller coupled to:
a second host interface for receiving a second plurality of access requests and conducting data in response to said second plurality of access requests, and
a second physical interface,
wherein said power engine is further responsive to a second predetermined event to cause said second memory channel controller to select an active rank of a second plurality of ranks and to place said other ranks besides said active rank in a low power state.

16. The data processor of claim 15 further comprising:
a first data processor physical interface coupled to said first physical interface of said first memory channel controller and adapted to be coupled to said first plurality of ranks; and
a second data processor physical interface coupled to said second physical interface of said second memory channel controller and adapted to be coupled to said second plurality of ranks.

17. The data processor of claim 10 wherein said memory controller processes a next command in said active rank in response to detecting that said first predetermined event is still active and determining not to select another rank based on predetermined criteria.

18. The data processor of claim 17 wherein said predetermined criteria comprise at least one pending request in said active rank.

19. The data processor of claim 17 wherein said predetermined criteria comprise at least one pending request in a current page in said active rank.

20. The data processor of claim 17 wherein said predetermined criteria comprise at least one pending request in said active rank and less than a predetermined number of requests for other ranks.

21. A method for throttling memory accesses to a memory system comprising:
detecting a thermal event; and
in response to detecting said thermal event:
selecting an active rank of a plurality of ranks coupled to a memory bus, wherein each rank comprises a set of memory devices that operate in lockstep to respond to a given command and that are coupled to a respective one of a plurality of chip select signals; and
placing other ranks of said plurality of ranks besides said active rank in a low power state, wherein said other ranks include at least one rank for which a memory controller stores a pending request,
processing at least one memory access request to said active rank.

22. The method of claim 21 wherein said memory system comprises a double data rate (DDR) memory system, and said placing said other ranks of said plurality of ranks in said low power state comprises placing said other ranks of said plurality of ranks in a DDR low power state.

23. The method of claim 21 wherein said detecting said thermal event comprises comparing a system temperature to a first threshold and determining that said system temperature is greater than or equal to said first threshold.

24. The method of claim 23 wherein said processing said at least one memory access request comprises:
processing a next command in said active rank;
detecting that said thermal event has not ended; and
determining whether to select another rank based on predetermined criteria.

25. The method of claim 24 wherein said determining whether to select another rank based on predetermined criteria comprises:
determining whether there is at least one pending request in said active rank.

26. The method of claim 24 wherein said determining whether to select another rank based on predetermined criteria comprises:
determining whether there is at least one pending request in a current page in said active rank.

27. The method of claim 24 wherein said determining whether to select another rank based on predetermined criteria comprises:
determining whether there is at least one pending request in said active rank and less than a predetermined number of requests for other ranks.

28. The method of claim 21 further comprising:
processing at least one access request in one of said plurality of ranks prior to said detecting said thermal event.

* * * * *